United States Patent
Won et al.

(10) Patent No.: US 11,651,975 B2
(45) Date of Patent: May 16, 2023

(54) STACK PACKAGE AND METHODS OF MANUFACTURING THE SAME

(71) Applicant: Samsung Electronics Co., Ltd., Suwon-si (KR)

(72) Inventors: Jae-in Won, Seoul (KR); Jong-kak Jang, Asan-si (KR); Dong-woo Kang, Seoul (KR); Do-Yeon Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/999,481

(22) Filed: Aug. 21, 2020

(65) Prior Publication Data

US 2020/0381267 A1 Dec. 3, 2020

Related U.S. Application Data

(63) Continuation of application No. 16/135,114, filed on Sep. 19, 2018, now Pat. No. 10,770,311.

(30) Foreign Application Priority Data

Sep. 21, 2017 (KR) .......................... 10-2017-0121868

(51) Int. Cl.
 *H01L 21/56* (2006.01)
 *H01L 25/065* (2023.01)
 (Continued)

(52) U.S. Cl.
 CPC .......... *H01L 21/563* (2013.01); *H01L 21/565* (2013.01); *H01L 23/49816* (2013.01);
 (Continued)

(58) Field of Classification Search
 CPC ................ H01L 21/563; H01L 21/565; H01L 23/49816
 See application file for complete search history.

(56) References Cited

U.S. PATENT DOCUMENTS 9,252,112 B2 2/2016 Kim et al.
9,397,080 B2 7/2016 Hsu et al.
(Continued)

FOREIGN PATENT DOCUMENTS

JP 2007173570 A 7/2007
JP 2014-207302 A 10/2014
(Continued)

OTHER PUBLICATIONS

First Office Action dated Sep. 29, 2021 for corresponding KR Patent Application No. 10-2017-0121868.
(Continued)

*Primary Examiner* — Errol V Fernandes
(74) *Attorney, Agent, or Firm* — Muir Patent Law, PLLC

(57) ABSTRACT

A stack package and a method of manufacturing the stack package are provided. The method includes: attaching a first semiconductor device onto a first surface of a first package substrate; attaching a molding resin material layer onto a first surface of a second package substrate; arranging the first surface of the first package substrate and the first surface of the second package substrate to face each other; compressing the first package substrate and the second package substrate while reflowing the molding resin material layer; and hardening the reflowed molding resin material layer.

14 Claims, 14 Drawing Sheets

(51) Int. Cl.
*H01L 25/00* (2006.01)
*H01L 23/498* (2006.01)
*H01L 23/00* (2006.01)
*H01L 25/10* (2006.01)

(52) U.S. Cl.
CPC .......... *H01L 24/45* (2013.01); *H01L 25/0657* (2013.01); *H01L 25/105* (2013.01); *H01L 25/50* (2013.01); H01L 23/49811 (2013.01); H01L 24/13 (2013.01); H01L 24/16 (2013.01); H01L 24/32 (2013.01); H01L 24/48 (2013.01); H01L 24/73 (2013.01); H01L 24/92 (2013.01); H01L 25/0655 (2013.01); H01L 2224/131 (2013.01); H01L 2224/13111 (2013.01); H01L 2224/16225 (2013.01); H01L 2224/16227 (2013.01); H01L 2224/32225 (2013.01); H01L 2224/4568 (2013.01); H01L 2224/45139 (2013.01); H01L 2224/45144 (2013.01); H01L 2224/45147 (2013.01); H01L 2224/45664 (2013.01); H01L 2224/45666 (2013.01); H01L 2224/45669 (2013.01); H01L 2224/45671 (2013.01); H01L 2224/45678 (2013.01); H01L 2224/45684 (2013.01); H01L 2224/48091 (2013.01); H01L 2224/48227 (2013.01); H01L 2224/73204 (2013.01); H01L 2224/92125 (2013.01); H01L 2225/0652 (2013.01); H01L 2225/06517 (2013.01); H01L 2225/1023 (2013.01); H01L 2225/1058 (2013.01); H01L 2924/1432 (2013.01); H01L 2924/1434 (2013.01); H01L 2924/1436 (2013.01); H01L 2924/1437 (2013.01); H01L 2924/1438 (2013.01); H01L 2924/1533 (2013.01); H01L 2924/15311 (2013.01); H01L 2924/15321 (2013.01)

(56) References Cited

U.S. PATENT DOCUMENTS

| | | | |
|---|---|---|---|
| 9,572,256 | B2 | 2/2017 | Yoshikawa et al. |
| 2002/0167093 | A1* | 11/2002 | Koike ............... H01L 21/563 257/E21.503 |
| 2006/0012037 | A1* | 1/2006 | Raedt ............... H01L 24/94 257/E21.705 |
| 2008/0136003 | A1 | 6/2008 | Pendse |
| 2009/0008765 | A1 | 1/2009 | Yamano et al. |
| 2011/0057330 | A1* | 3/2011 | Ushiyama ........... H01L 23/48 257/779 |
| 2014/0042608 | A1* | 2/2014 | Kim .................. H01L 23/04 257/686 |
| 2014/0313681 | A1 | 10/2014 | Yamano et al. |
| 2015/0249065 | A1 | 9/2015 | Pagaila |
| 2016/0141268 | A1 | 5/2016 | Nakamura et al. |
| 2017/0125373 | A1 | 5/2017 | Morita et al. |
| 2017/0243857 | A1* | 8/2017 | Hwang ............... H01L 24/17 |
| 2017/0345797 | A1 | 11/2017 | Honda |

FOREIGN PATENT DOCUMENTS

| | | |
|---|---|---|
| JP | 2014-216526 A | 11/2014 |
| JP | 2015-128146 A | 7/2015 |
| KR | 10-2007-0069715 A | 7/2007 |
| KR | 10-2011-0077952 A | 7/2011 |
| KR | 10-1550197 B1 | 9/2015 |
| KR | 1020160059964 A | 5/2016 |

OTHER PUBLICATIONS

Office Action dated Apr. 26, 2022 issued by the Korean Intellectual Property Office for corresponding KR Patent Application No. 10-2017-0121868.

\* cited by examiner

STACK PACKAGE AND METHODS OF MANUFACTURING THE SAME

CROSS-REFERENCE TO RELATED APPLICATION

This application is a continuation of and claims priority to U.S. patent application Ser. No. 16/135,114 filed on Sep. 19, 2018, which claims the benefit of priority under 35 U.S.C. § 119 to Korean Patent Application No. 10-2017-0121868, filed on Sep. 21, 2017, in the Korean Intellectual Property Office, the disclosure of which is incorporated herein in its entirety by reference.

BACKGROUND

The inventive concept according to example embodiments relates to a stack package and methods of manufacturing the same, and more particularly, to a stack package with high reliability which may be manufactured easily and promptly and manufacturing methods thereof.

A package stacking technique is used in order to reduce sizes and weights of electronic products. Package stacking for package-on-package devices according to the related art includes forming holes in a mold layer of a lower package using laser drilling, and forming connectors made of solder balls in the holes. However, this process is often highly complicated and may require a relatively long time in manufacturing. In addition, improved reliability of manufactured stack packages would be desirable.

SUMMARY

The inventive concept according to example embodiments provides a method of easily and promptly manufacturing a stack package having high reliability.

The inventive concept according to example embodiments provides a stack package with high reliability which may be easily and promptly manufactured.

According to an aspect of the inventive concept, there is provided a method of manufacturing a stack package, including: attaching a first semiconductor device on a first surface of a first package substrate; attaching a molding resin material layer on a first surface of a second package substrate; arranging the first surface of the first package substrate and the first surface of the second package substrate to face each other; compressing the first package substrate and the second package substrate while reflowing the molding resin material layer; and hardening the reflowed molding resin material layer.

According to another aspect of the inventive concept, there is provided a method of manufacturing a stack package, the method including: arranging a first surface of a first package substrate and a first surface of a second package substrate to be opposed to each other, wherein a first semiconductor device and a plurality of first conductive connection terminals are provided on the first surface of the first package substrate and a molding resin material layer and a plurality of second conductive connection terminals corresponding to the plurality of first conductive connection terminals are provided on the first surface of the second package substrate; and joining the first package substrate and the second package substrate by raising temperatures of the first package substrate and the second package substrate, wherein the joining of the first package substrate and the second package substrate by raising the temperatures of the first package substrate and the second package substrate includes: reflowing the molding resin material layer; and electrically connecting the first package with the second package substrate, wherein the step of reflowing of the molding resin material layer partially and temporally overlaps with the step of the electrically connecting of the first package substrate and the second package substrate.

According to another aspect of the inventive concept, there is provided a stack package, including: a first package substrate on which a first semiconductor device is mounted; a second package substrate provided on the first semiconductor device; a connector connecting a terminal on the first package substrate and a terminal on the second package substrate corresponding thereto; and molding resin encircling the connector while filling a portion between the first package substrate and the second package substrate, wherein the molding resin contacts the connector with respect to all side surfaces of the connector.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
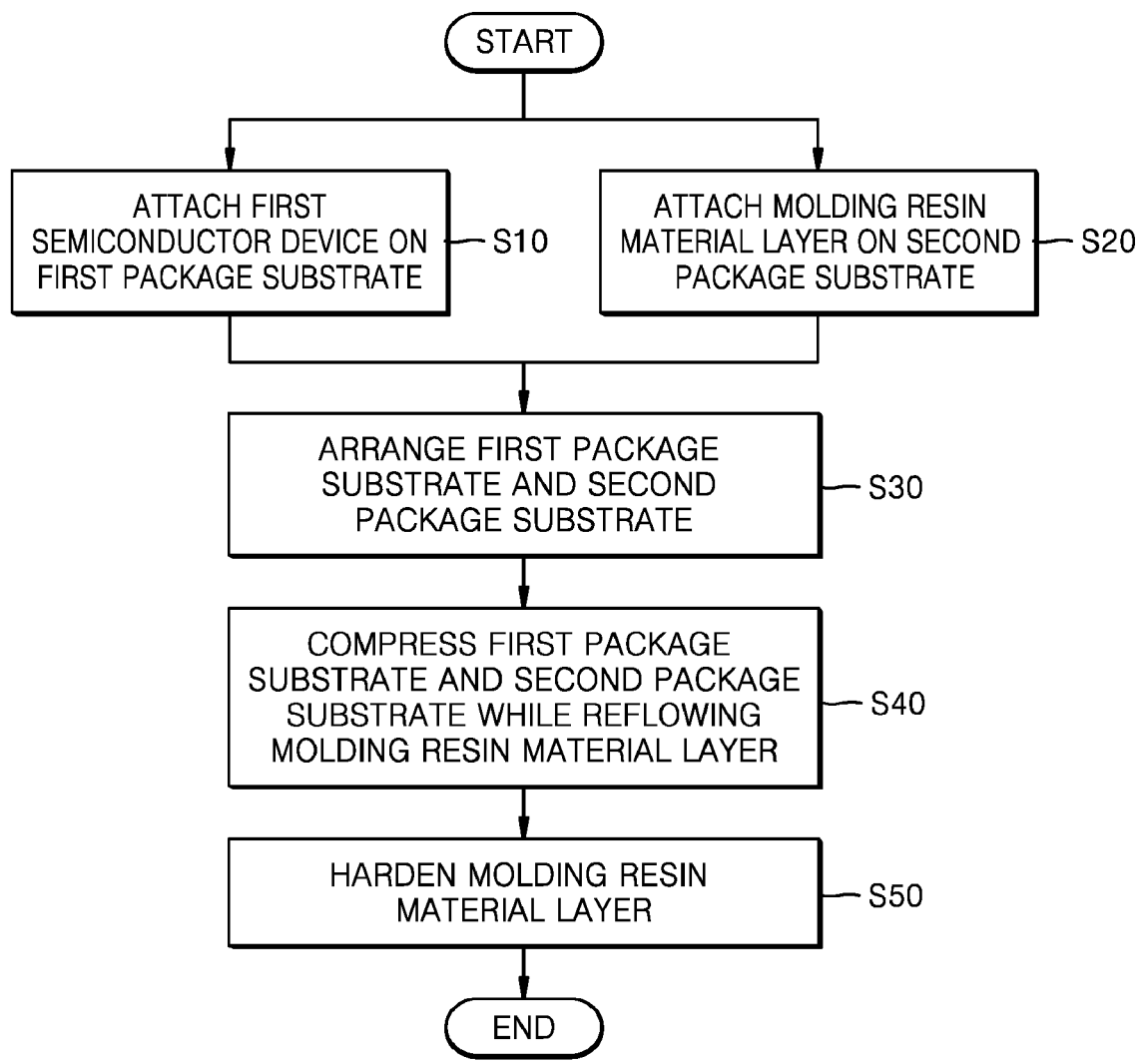
FIG. 1 is a flowchart illustrating a method of manufacturing a stack package, according to an exemplary embodiment of the inventive concept.

FIG. 1 is a flowchart illustrating a method of manufacturing a stack package according to an exemplary embodiment. FIGS. 2A through 2F are side cross-sectional views sequentially illustrating a manufacturing method of the stack package according to the exemplary embodiment.

Figure 2A:
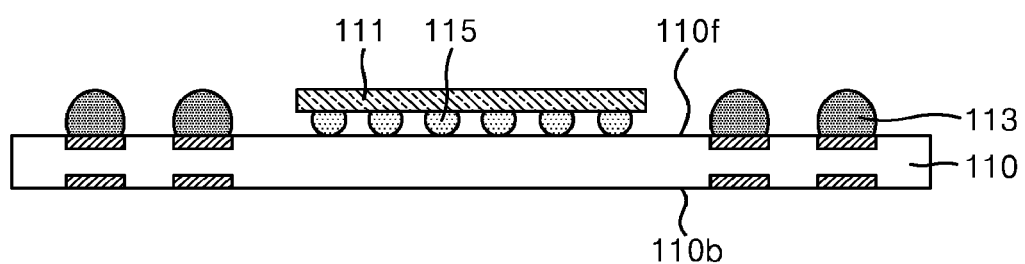
FIGS. 2A through 2F are side cross-sectional views sequentially illustrating a method of manufacturing the stack package, according to an exemplary embodiment of the inventive concept.

With reference to FIGS. 1 and 2A, a first semiconductor device 111 and a plurality of first conductive connection terminals 113 are attached on a first surface 110f of a first package substrate 110 (S10). The first semiconductor device 111 and the plurality of first conductive connection terminals 113 may be attached to the first surface 110f simultaneously or sequentially according to a predetermined order. For example, in one embodiment, the first semiconductor device 111 and the plurality of first conductive connection terminals 113 may be attached to the first surface 110f of the first package substrate 110 at the same time. Alternatively, in another embodiment, the first semiconductor device 111 may be attached to the first surface 110f of the first package substrate 110 first and then the plurality of first conductive connection terminals 113 may be attached to the first surface 110f of the first package substrate 110 after attaching the first semiconductor device 111 to the first surface 110f of the first package substrate 110. Yet, in another embodiment, the first semiconductor device 111 may be attached to the first surface 110f of the first package substrate 110 after attaching the plurality of first conductive connection terminals 113 to the first surface 110f of the first package substrate 110.

The first package substrate 110 may be a printed circuit board (PCB). For example, the first package substrate 110 may be a double-sided PCB or a multi-layer PCB. The first package substrate 110 may include at least one base layer, a plurality of first surface connection pads and a plurality of second surface connection pads respectively arranged on the first surface 110f and a second surface 110b opposing the first surface 110f in a vertical direction.

A first surface solder resist layer and a second surface solder resist layer may be provided respectively on the first surface 110f and the second surface 110b of the base layer of the first package substrate 110. The second surface connection pads may be exposed on the second surface 110b of the first package substrate 110 without being covered by the second surface solder resist layer. In some embodiments, the first surface solder resist layer may be omitted without being arranged on the first surface 110f of the first package substrate 110. In some embodiments, the first package substrate 110 may include a plurality of stacked base layers. In some embodiments, the at least one base layer may include at least one material from among phenolic resin, epoxy resin, and polyimide resin.

The first conductive connection terminals 113 may be attached on the first surface connection pads. The various pads of a device described herein may be conductive terminals connected to internal wiring of the device, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

The first conductive connection terminals 113, for example, may be solder balls or bumps. The solder balls or bumps may include components that may be melted at a reflow temperature of solder, and may have a uniform composition or a multiple layer structure. The first conductive connection terminals 113, for example, may be solder balls or bumps including silver (Ag) and/or copper (Cu) and having tin (Sn) as a main ingredient. However, the first conductive connection terminals 113 are not limited thereto.

The first semiconductor device 111 may be a semiconductor chip, or may be a semiconductor package. As used herein, the first semiconductor device 111 may be in the form of, for example, a semiconductor chip or die, formed from a semiconductor wafer. The term "semiconductor device" as used herein may also refer to a semiconductor package, including a package substrate, one or more semiconductor chips, and an encapsulant. The first semiconductor device 111 may be central processing unit (CPU), micro processing unit (MPU), graphics processing unit (GPU) or application processor (AP). In some embodiments, the first semiconductor device 111 may include nonvolatile memory semiconductor devices such as flash memory, phase-change random access memory (PRAM), magnetoresistive random access memory (MRAM), ferroelectric random access memory (FeRAM) or resistive random access memory (RRAM). The flash memory, for example, may be a V-NAND flash memory. In some embodiments, the first semiconductor device 111 may include volatile memory semiconductor devices such as a dynamic random access memory (DRAM) or a static random access memory (SRAM). In some embodiments, the first semiconductor device 111 may include controller semiconductor chips to control the nonvolatile memory semiconductor devices.

The first semiconductor device 111 may be electrically connected to the first package substrate 110 by connection terminals 115. The connection terminals 115 may be smaller than the first conductive connection terminals 113, and may be solder balls or bumps including tin (Sn).

Figure 2B:
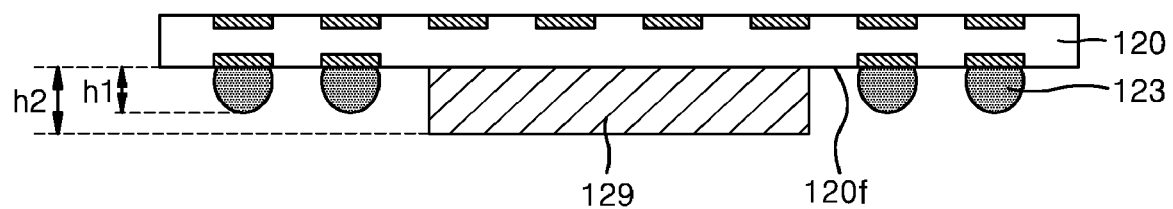

With reference to FIGS. 1 and 2B, a molding resin material layer 129 and a plurality of second conductive connection terminals 123 are attached under a first surface 120f of a second package substrate 120 (S20). The molding resin material layer 129 and the plurality of second conductive connection terminals 123 may be attached under the first surface 120f simultaneously or sequentially according to a predetermined order. For example, in one embodiment, the molding resin material layer 129 and the plurality of second conductive connection terminals 123 may be attached to the first surface 120f of the second package substrate 120 at the same time. Alternatively, in another embodiment, the molding resin material layer 129 may be attached to the first surface 120f of the second package substrate 120 first and then the plurality of second conductive connection terminals 123 may be attached to the first surface 120f of the second package substrate 120 after attaching the molding resin material layer 129 to the first surface 120f of the second package substrate 120. Yet, in another embodiment, the molding resin material layer 129 may be attached to the first surface 120f of the second package substrate 120 after attaching the plurality of second conductive connection terminals 123 to the first surface 120f of the second package substrate 120. The second package substrate 120 may be, for example, a package substrate for an upper package to be placed on the package shown in FIG. 2A, which may be a lower package. Though not shown, the upper package may include one or more semiconductor devices stacked on a top surface thereof, connected to the upper pads shown in FIG. 2B.

As the second conductive connection terminals 123 may be substantially identical to the first conductive connection terminals 113 described with reference to FIG. 2A, detailed descriptions thereabout will be omitted herein. According to an exemplary embodiment, a plurality of first conductive connection terminals 113 may be provided on the first surface 110f of the first package substrate 110, and a plurality of second conductive connection terminals 123 may be provided on the first surface 120f of the second package substrate 120, each of the plurality of second conductive connection terminals 123 respectively corresponding to each of the plurality of first conductive connection terminals 113.

The molding resin material layer 129 may be a polymer material layer which has fluidity increasing due to increase of temperature. The molding resin material layer 129 may include an epoxy resin as a matrix component and further include a component that can be cross-linked with the epoxy resin, e.g., phenol-based resin. Also, the molding resin material layer 129 may further include an elastomer component to give elasticity to the material layer.

The epoxy resin, for example, may be a phenoxy resin or an epoxy resin that is chosen from triphenylmethane type, cresol novolak type, biphenyl type, bisphenol A type, modified bisphenol A type, bisphenol F type, modified bisphenol F type, dicyclopentadiene type, phenol novolak type, but the epoxy resin is not limited thereto.

Components which may be cross-linked with the epoxy resin may be phenol novolak resin, phenol aralkyl resin, biphenyl aralkyl resin, dicyclopentadiene type phenol resin, cresol novolak resin, resol resin, but the components are not limited thereto. The resins may be used alone or in combinations of two or more.

The elastomer components may be isoprene rubber, ethylene-vinyl acetate copolymer, styrene-butadiene rubber, butadiene rubber, styrene acrylate copolymer, acrylic copolymer (for example, polyacrylate ester), acrylonitrile rubber, but the components are not limited thereto. The elastomer components may be used alone or in combinations of two or more.

The material composition of the molding resin material layer 129 is such that the molding resin material layer 129 may be transformed with elasticity by a force from an exterior portion and have flexibility. Also, in some embodiments, the molding resin material layer 129 may be attached on the first surface 120f by a van der Waals force. In other embodiments, the molding resin material layer 129 may be attached on the first surface 120f with an adhesive component interposed therebetween.

A thickness h2 of the molding resin material layer 129 may be greater than a height h1 in a vertical direction of the second conductive connection terminals 123. If the thickness h2 of the molding resin material layer 129 is smaller than the height h1 of the second conductive connection terminals 123 in a vertical direction, a space between the first package substrate 110 and the second package substrate 120 may not be sufficiently filled by molding resin. More particularly, the thickness h2 of the molding resin material layer 129 before being reflowed is greater than the height h1 in the vertical direction of the second conductive connection terminals 123.

In some embodiments, the molding resin material layer 129 may be provided on a region where the second conductive connective terminals 123 are not formed on the first surface 120f of the second package substrate 120. In other embodiments, the molding resin material layer 129 may be provided to cover at least one of the second conductive connection terminals 123 on the first surface 120f of the second package substrate 120.

The attaching of the first semiconductor device 111 and the plurality of first conductive connection terminals 113 on the first surface 110f of the first package substrate 110 (S10) and the attaching the molding resin material layer 129 and the plurality of second conductive connection terminals 123 on the first surface 120f of the second package substrate 120 (S20) may be performed simultaneously. In an alternative embodiment, the first semiconductor device 111 and the plurality of first conductive connection terminals 113 may be attached to the first surface 110f of the first package substrate 110 before attaching the molding resin material layer 129 and the plurality of second conductive connection terminals 123 to the first surface 120f of the second package substrate 120. Yet, in another embodiment, the first semiconductor device 111 and the plurality of first conductive connection terminals 113 may be attached to the first surface 110f of the first package substrate 110 after attaching the molding resin material layer 129 and the plurality of second conductive connection terminals 123 to the first surface 120f of the second package substrate 120.

Figure 2C:
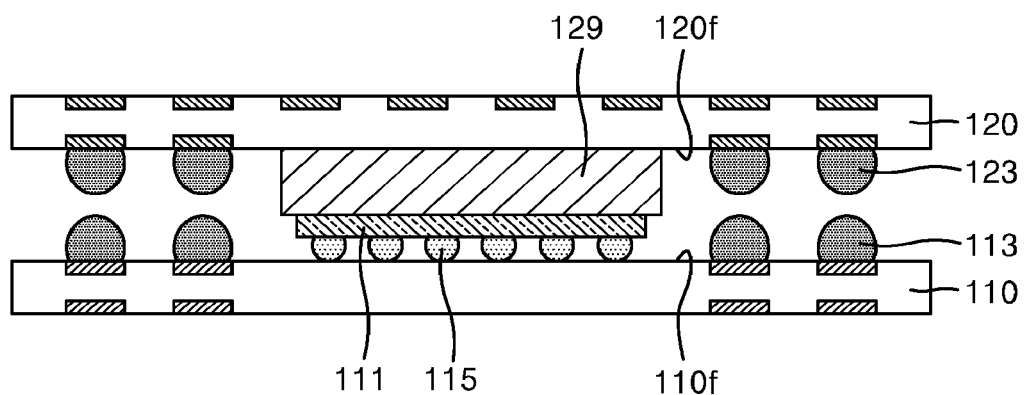

With reference to FIGS. 1 and 2C, the first surface 110f of the first package substrate 110 and the first surface 120f of the second package substrate 120 may be arranged to be opposed to each other in a vertical direction (S30). Although one of the surfaces of the molding resin material layer 129 and one of the surfaces of the first semiconductor device 111 are illustrated to contact each other in FIG. 2C, the surfaces may not contact each other in the arranging of the surfaces (S30).

Figure 3:
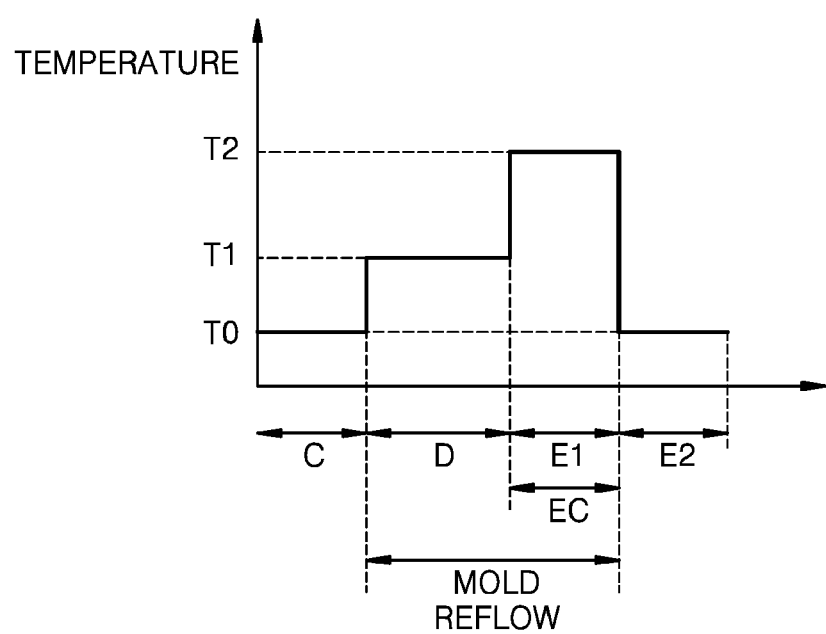
FIG. 3 is a graph with respect to relationships between operations described with reference to FIGS. 2C through 2E and temperatures at which the operations are respectively performed.

FIG. 3 is a graph conceptually illustrating relationships between each of operations to be described hereinafter and temperatures at which the operations are performed. On a horizontal axis of FIG. 3, a section marked with C corresponds to a section in which the operation described with reference to FIG. 2C is performed.

Referring to FIG. 3, the operation described with reference to FIG. 2C, for example, the operation in which the first surface 110f of the first package substrate 110 and the first surface 120f of the second package substrate 120 may be arranged to be opposed to each other (S30) may be performed at a temperature of T0. In this case, the temperature of T0 may be from a room temperature to about 80° C., but not limited thereto.

Figure 2D:
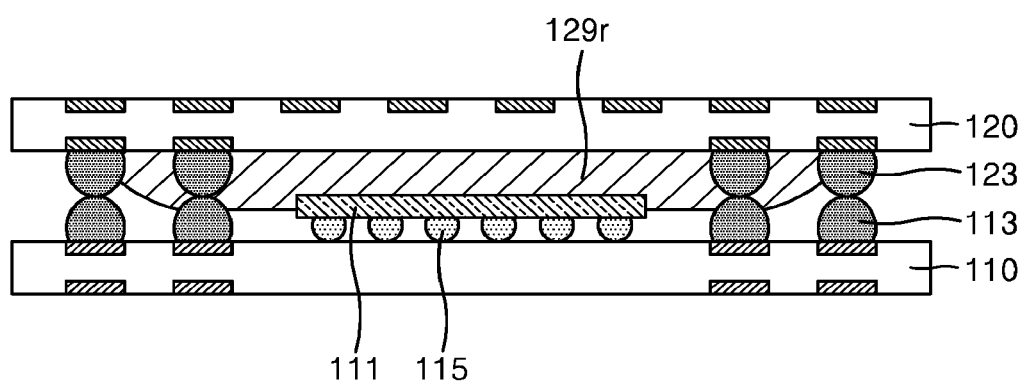

Referring to FIGS. 1, 2D, and 3, the first package substrate 110 and the second package substrate 120 may be compressed while reflowing the molding resin material layer 129 at an elevated temperature T1 (S40). On the horizontal axis of FIG. 3, a section marked with D may correspond to a section in which the operation described with reference to FIG. 2D is performed.

For convenience, it is illustrated in FIG. 3 that the temperature increased in the form of a step from the temperature of T0 in section C to the temperature of T1 in section D, but a section in which the temperature precipitously increases from the temperature of T0 to the temperature of T1 may exist between section C and section D.

In some embodiments, in a state where the first package substrate 110 is fixed, the second package substrate 120 may be pressed toward the first package substrate 110. In other embodiments, in a state where the second package substrate 120 is fixed, the first package substrate 110 may be pressed toward the second package substrate 120.

In order to reflow the molding resin material layer 129, an ambient temperature may be raised to T1. The temperature of T1 may be a temperature at which the molding resin material layer 129 is reflowed but the first conductive connection terminals 113 and/or the second conductive connection terminals 123 are not reflowed. More particularly, when the first conductive connection terminals 113 and/or the second conductive connection terminals 123 are made of low temperature solder that is reflowed at relatively low temperatures, the temperature of T1 may be from about 80° C. to about 120° C. When the first conductive connection terminals 113 and/or the second conductive connection terminals 123 are made of high temperature solder that is reflowed at relatively high temperatures, the temperature of T1 may be from about 80° C. to about 180° C. More particularly, the reflowing of the molding resin material layer 129 may include heating the molding resin material layer 129 up to the first temperature T1 and the electrical connecting of the first package substrate 110 and the second package substrate 120 may include heating the plurality of first conductive connection terminals 113 and the plurality of second conductive connection terminals 123 up to a second temperature T2 higher than the first temperature T1.

As the molding resin material layer 129 is reflowed at the temperature of T1, the reflowed molding resin material layer 129r may move toward a peripheral region with fluidity, as illustrated in FIG. 2D. Particularly, the first conductive connection terminals 113 may contact the second conductive connection terminals 123 corresponding thereto, and the reflowed molding resin material layer 129r may gradually move covering around the first conductive connection terminals 113 and the second conductive connection terminals 123.

As described above, as the temperature of T1 is lower than a temperature which may reflow the first conductive connection terminals 113 and/or the second conductive connection terminals 123, the first and second conductive connection terminals 113 and 123 may not be melted and bonded. Also, depending how close the first package substrate 110 and the second package substrate 120 are, the first conductive connection terminals 113 and the second conductive connection terminals 123 may be separated, or may contact each other as illustrated in FIG. 2D. Even if the first conductive connection terminals 113 contact the second conductive connection terminals 123, as the first and second conductive connection terminals 113 and 123 are not reflowed and unified, the first and second conductive connection terminals 113 and 123 may be considered not to have been electrically connected.

Figure 2E:
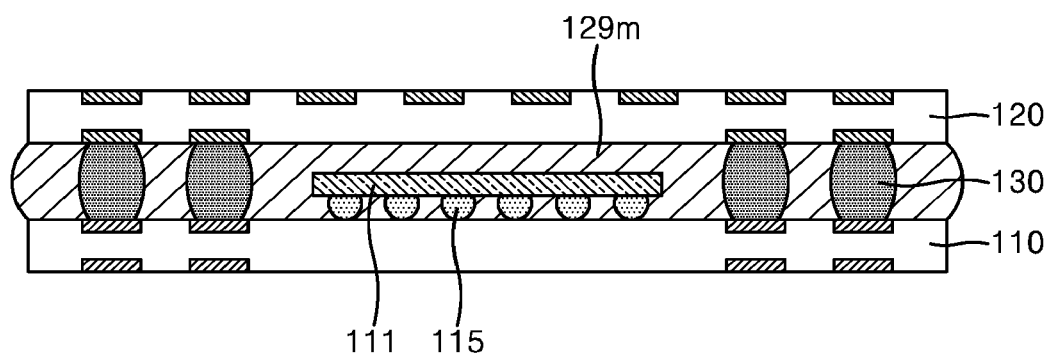

With reference to FIGS. 1, 2E, and 3, the first package substrate 110 and the second package substrate 120 may be further compressed while heating the molding resin material layer 129 to a further elevated temperature T2. On the horizontal axis of FIG. 3, a section marked with E1 may correspond to a section in which an operation described with reference to FIG. 2E is performed.

For convenience, it is illustrated in FIG. 3 that the temperature increased in the form of a step from the temperature of T1 in section D to the temperature of T2 in section E1, but a section in which the temperature precipitously increases from the temperature of T1 to the temperature of T2 may exist between section D and section E1.

As illustrated in FIG. 3, the temperature may be raised to T2 in order to further heat the molding resin material layer 129. The temperature T2 may be a temperature at which the first conductive connection terminals 113 and the second conductive connection terminals 123 may be reflowed while a cross-linking reaction in the molding resin material layer 129 may occur. More particularly, when the first conductive connection terminals 113 and/or the second conductive connection terminals 123 are made of low temperature solder that is reflowed at relatively lower temperatures, the temperature of T2 may be from about 120° C. to about 180° C. When the first conductive connection terminals 113 and/or the second conductive connection terminals 123 are made of high temperature solder that is reflowed at relatively high temperatures, the temperature of T2 may be from about 180° C. to about 300° C.

In this operation, the first conductive connection terminals 113 and the second conductive connection terminals 123 may be bonded and unified, and thus, the first package substrate 110 and the second package substrate 120 may be electrically connected. Electrically connected, as described herein, refers to a connection between two conductive or semi-conductive components connected in a manner such that an electrical signal can pass from one component to the other. The first conductive connection terminals 113 and the second conductive connection terminals 123 may form connectors 130 by being integrated and unified. The connectors 130 will be described in more detail hereinafter.

A starting point of an operation of reflowing the molding resin material layer 129 (between section C and section D) may be earlier than a starting point of the operation of electrically connecting the first package substrate 110 and the second package substrate 120 (between section D and section E1). Also, as the reflowing operation on the reflowed molding resin material layer 129r may last at least for a predetermined time in section E1 illustrated in FIG. 3, the reflowing of the molding resin material layer 129 and electrically connecting the first package substrate 110 and the second package substrate 120 may overlap partially and temporally.

As the molding resin material layer 129r reflowed at the temperature of T2 is cooled down back to the temperature of T0, a molding resin material layer 129m may be manufactured. The molding resin material layer 129m may be hardened by the cooling operation (S50). On the horizontal axis of FIG. 3, a section marked with E2 may correspond to a section in which the hardening operation among operations described with reference to FIG. 2E is performed.

The hardened molding resin material layer 129m may completely fill a space between the first package substrate 110 and the second package substrate 120. In some embodiments, the hardened molding resin material layer 129m may protrude in lateral directions of the first package substrate 110 and the second package substrate 120.

Figure 2F:
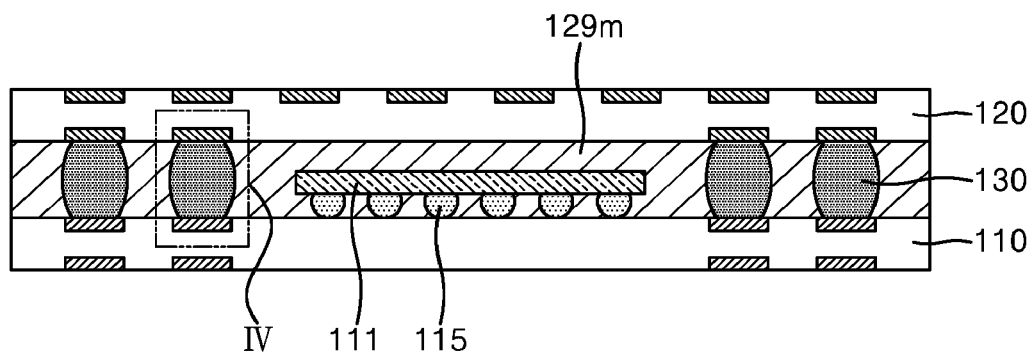

With reference to FIG. 2F, if there are such lateral protrusions, the lateral protrusions may be eliminated by trimming. Such protrusions may make it difficult to handle the stack packages and may also increase footprints of the stack package because of the difficulties in controlling the protrusions (for example, irregular degrees of protruding between the protrusions). Therefore, the protrusions may be eliminated by using methods such as laser beam machining, grinding, etching, etc.

Figure 4A:
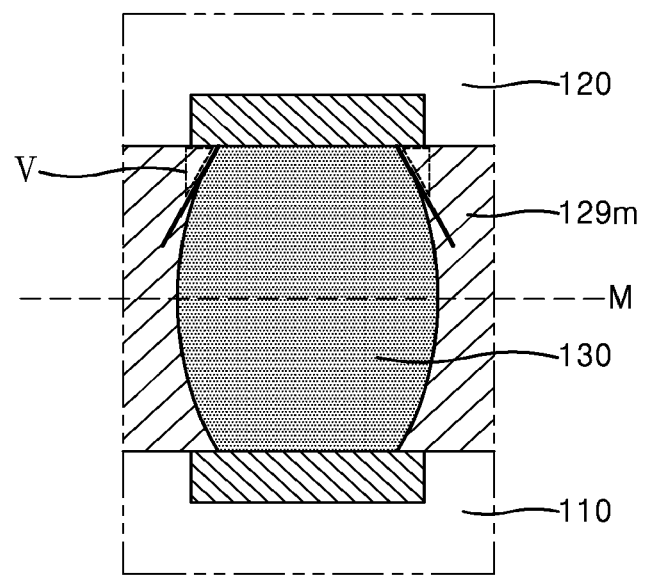
FIGS. 4A and 4B are partially enlarged views illustrating enlarged images of a part IV in FIG. 2F.
Figure 4B:
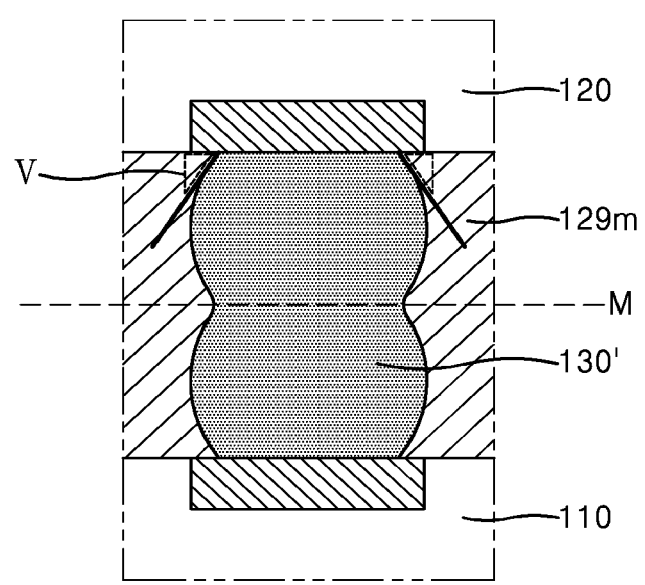

FIGS. 4A and 4B are partial enlarged views illustrating enlarged images of a part marked with IV of FIG. 2F according to exemplary embodiments.

Referring to FIG. 4A, the connector 130 may electrically connect the first package substrate 110 and the second package substrate 120. Also, in the connector 130, an upper portion higher than a centerline M and a lower portion lower than the centerline M may substantially be symmetrical to each other. For example, when the connector 130 in FIG. 4 is folded with the centerline M as a center, the upper portion and the lower portion may overlap.

In some embodiments, the connector 130 may have an oval form in which an upper end and a lower end are cut off as illustrated in FIG. 4A. For example, the connector 130 may have a larger horizontal cross-sectional area on the centerline M. Also, the farther the horizontal cross-sectional area becomes from the centerline M, the horizontal cross-sectional area may monotonously (gradually) decrease.

Referring to FIG. 4B, the connectors 130' may have the shape of number 8 in which an upper end and a lower end are cut off. The shape of the connectors 130' may be understood in a regard that the connectors 130' are formed out of the first conductive connection terminals 113 and the second conductive connection terminals 123 having the form of a sphere. Like what is described in FIG. 4A, in the connector 130', an upper portion higher than the centerline M and a lower portion lower than the centerline M may be substantially symmetrical to each other.

In FIG. 4B, it is illustrated that the upper portion and the lower portion of the connector 130' are symmetrical to each other, and when the connector 130' is folded with the centerline M as a center, the upper portion and the lower portion may overlap. However, in some embodiments, the upper portion and the lower portion of the connector 130' may be slightly offset from each other in a horizontal direction.

Contact angles at parts on which the connectors 130 and 130' contact the second package substrate 120 in FIGS. 4A and 4B may be defined as acute angles between auxiliary lines drawn in FIGS. 4A and 4B and horizontal lines, and magnitudes of the angles may be substantially uniform. Although the auxiliary lines representing the contact angles are illustrated only on portions where the connectors 130 and 130' and the second package substrate 120 contact, the contact angles may also be defined in an identical manner with respect to portions where the connectors 130 and 130' and the first package substrate 110 contact. Furthermore, the contact angles between the connectors 130 and 130' and the second package substrate 120 may be substantially identical to the contact angles between the connectors 130 and 130' and the first package substrate 110.

Also, in some embodiments, the contact angles between the connectors 130 and 130' and the second package substrate 120 may be uniform in each of the connectors 130 and 130'. The contact angles between the connector 130 and 130' and the first package substrate 110 may be uniform in each of the connectors 130 and 130'.

Figure 12:
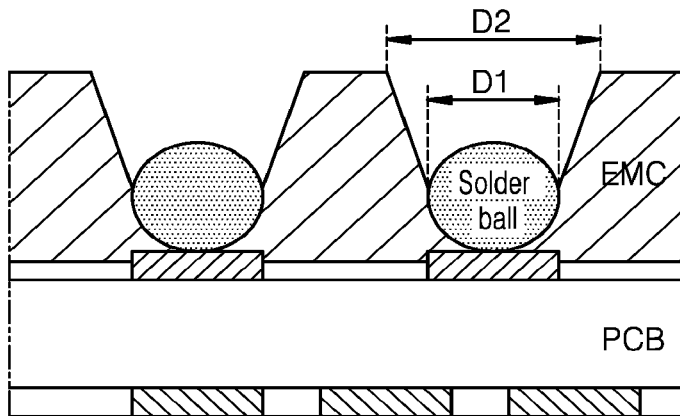
FIG. 12 is a mimetic diagram illustrating an image in which a lower package substrate has undergone a laser drilling operation to connect an upper package substrate thereto, according to the related art.
Figure 13:
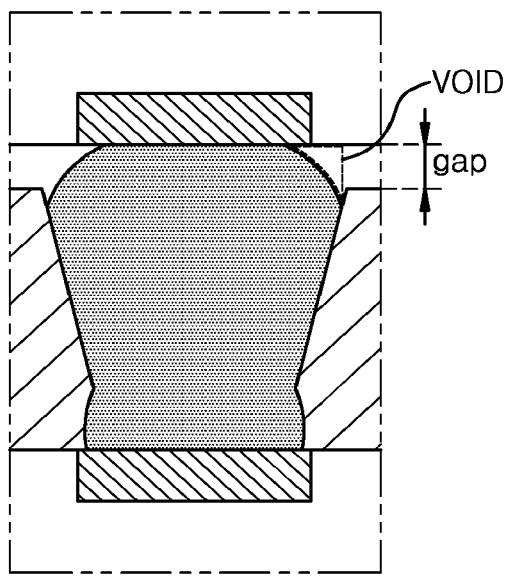
FIG. 13 is a partial side cross-sectional view illustrating a concept of connectors which connect the upper package substrate with the lower package substrate, according to the related art.

FIG. 12 is a mimetic diagram illustrating an image in which the lower package substrate has undergone a laser drilling operation to connect the upper package substrate thereto according to conventional art, and FIG. 13 is a partial side cross-sectional view conceptually illustrating the connector which connects the upper package substrate and the lower package substrate according to conventional art.

First, Referring to FIG. 12, holes to expose solder balls may be formed by laser drilling on the lower package substrate for the electric connection with the upper package substrate. The holes may have tapered sides so that extra solder balls or bumps provided for the electric connections with the upper package substrate may be stably accepted into inner portions of the holes.

The holes with the tapered sides have diameters of D1 on points contacting the solder balls in FIG. 12, but the holes have diameters of D2 remarkably greater than D1 at an upper surface. Thus, a conventional method of connecting the lower package substrate and the upper package substrate by forming the holes having the tapered sides by laser drilling may make it difficult to form the connectors more delicately.

Connectors each having an aspect like illustrated in FIG. 13 may be made by accepting the extra solder balls into the holes while pressing the upper package substrate downward and reflowing the solder balls. With reference to FIG. 13, even though the upper package substrate and the lower package substrate are tightly attached, a gap may easily be formed between the package substrates, and even though the gap between the upper package substrate and the lower package substrate is substantially eliminated, voids are inevitably formed near upper edges of the connectors.

Such gap and voids may cause lower reliability of the package by making empty portions in molding members.

Referring back to FIGS. 4A and 4B, the upper package substrate and the lower package substrate may be electrically connected to each other by the connectors 130 and 130' without forming voids in portions where the voids were formed in FIG. 13 (portions marked with V in FIGS. 4A and 4B). For example, the molding resin material layer 129m may contact the connectors 130 with respect to an entire side of the connectors 130 between the first package substrate 110 and the second package substrate 120.

FIGS. 5A through 5F are partial cross-sectional views illustrating a manufacturing method of a stack package according to an exemplary embodiment. FIG. 6 is a graph illustrating pressures in molds, distances between the molds, and temperatures in the molds according to each of the operations illustrated in FIGS. 5A through 5F. On a horizontal axis of FIG. 6, each of sections marked with A through F corresponds to each of the operations in FIGS. 5A through 5F.

Figure 5A:
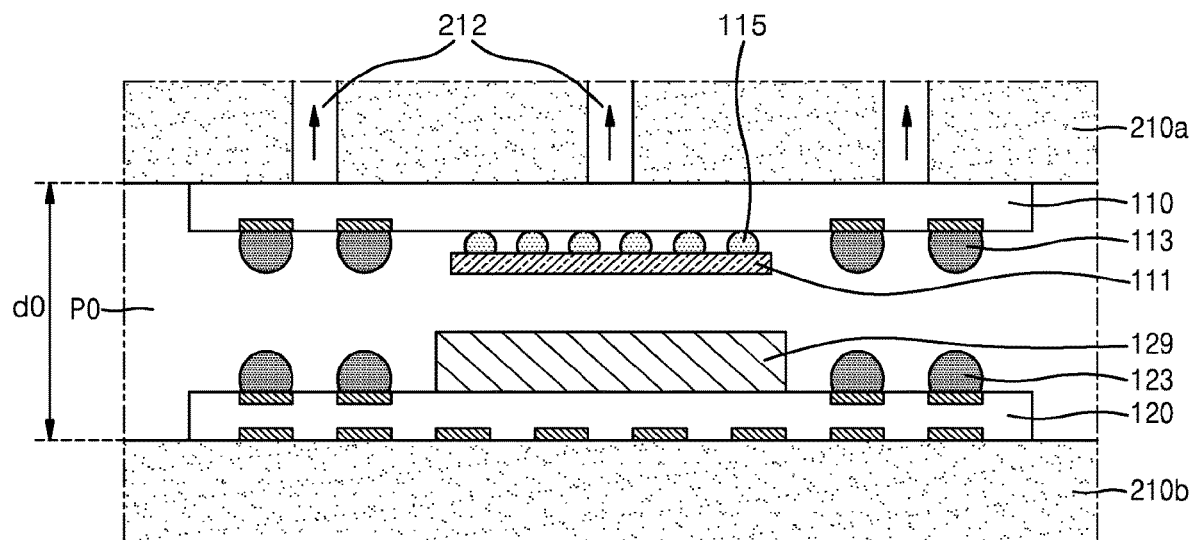
FIGS. 5A through 5F are partial cross-sectional views illustrating a method of manufacturing a stack package, according to an exemplary embodiment of the inventive concept.
Figure 6:
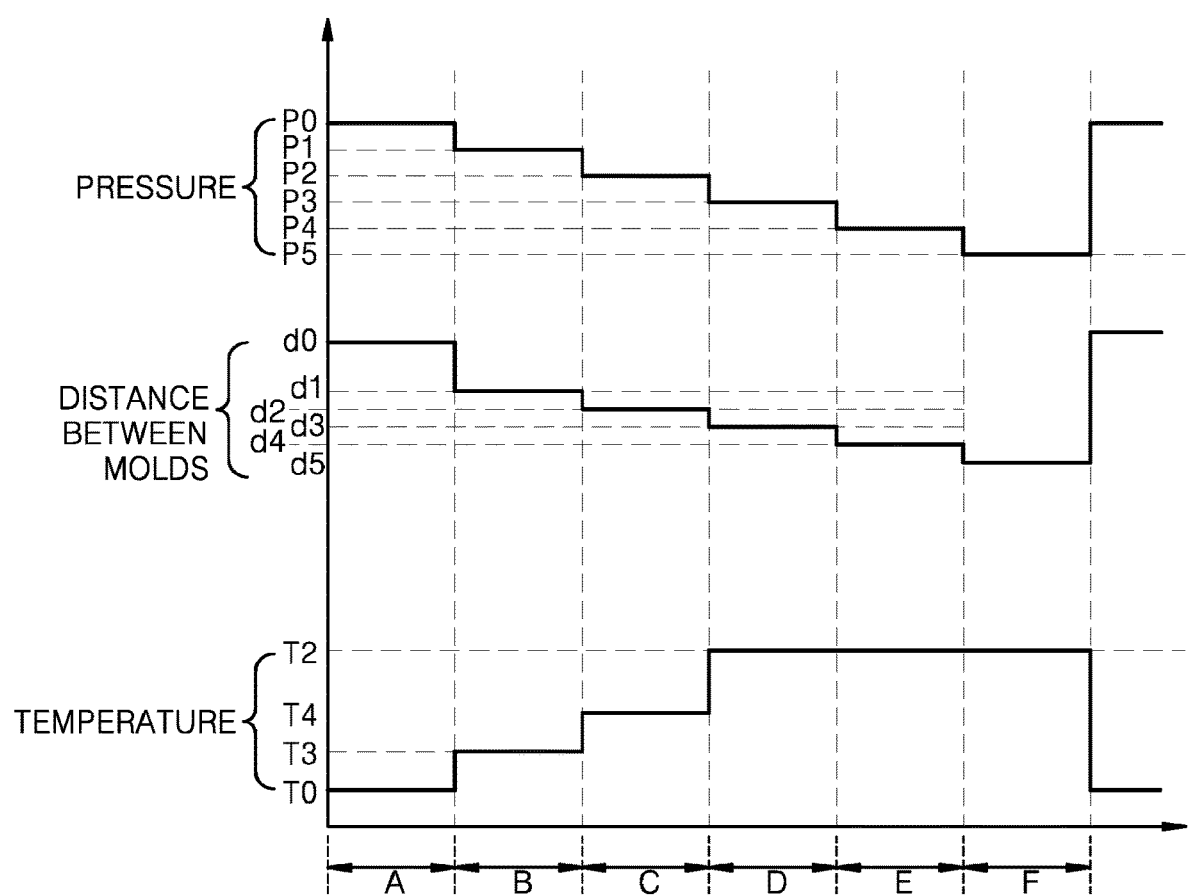
FIG. 6 is a graph of pressures in molds, distances between the molds, and temperatures in the molds according to each of the operations illustrated in FIGS. 5A through 5F.

With reference to FIGS. 5A and 6, the first package substrate 110 may be fixed to an upper mold 210a. Also, the second package substrate 120 may be fixed to a lower mold 210b.

The upper mold 210a and the lower mold 210b may be configured to increase or decrease a distance between the molds by relative motions. Also, the upper mold 210a may be configured to fix the first package substrate 110 by using vacuum holes 212. Accordingly, in spite of a gravity, the first package substrate 110 may be fixed to the upper mold 210a.

A first semiconductor device 111 and the plurality of first conductive connection terminals 113 may be attached under the first package substrate 110. Also, the molding resin material layer 129 and the plurality of second conductive connection terminals 123 may be attached on the second package substrate 120. As this exemplary embodiment has been described in detail with reference to FIGS. 2A and 2B, further descriptions will be omitted herein.

In a state where the first package substrate 110 and the second package substrate 120 are arranged to be opposed to each other and respectively fixed to the upper mold 210a and the lower mold 210b, a pressure between the molds may be P0, and the pressure of P0, for example, may be an atmospheric pressure. Also, a distance between the upper mold 210a and the lower mold 210b may be d0, and a temperature between the molds may be a first temperature T0. The first temperature T0 may be from the room temperature to about 80° C., but it is not limited thereto. In this exemplary embodiment, the arranging of the first surface 110f of the first package substrate 110 and the first surface 120f of the second package substrate 120 to face each may include fixing the first package substrate 110 to the upper mold 210a and fixing the second package substrate 120 to the lower mold 210b, and compressing the first package substrate 110 and the second package substrate 120, after being fixed to the upper mold 210a and the lower mold 210b, respectively, may include reducing a pressure between the first package substrate 110 and the second package substrate 120.

Figure 5B:
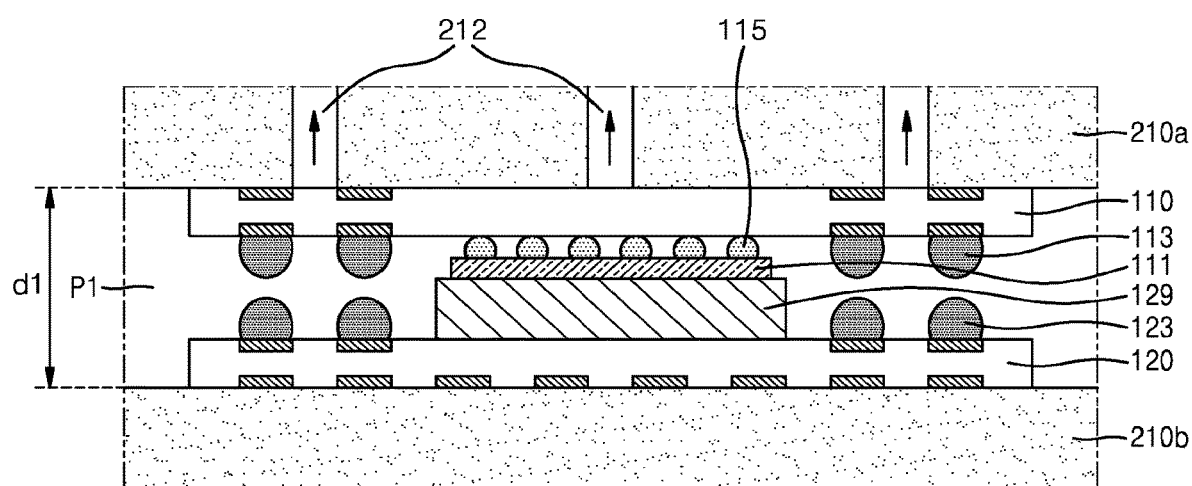

With reference to FIGS. 5B and 6, an upper surface of the molding resin material layer 129 may contact one of surfaces of the first semiconductor device 111 by decreasing the distance between the upper mold 210a and the lower mold 210b to d1.

In this exemplary embodiment, the pressure between the molds may be decreased to P1 that is lower than P0 and the temperature between the molds may be increased to a third temperature T3 that is higher than the first temperature T0. The third temperature of T3 may be lower or higher than a temperature at which the molding resin material layer 129 starts to be reflowed. However, the third temperature T3 is lower than a temperature at which the first conductive connection terminals 113 and/or the second conductive connection terminals 123 start being reflowed. In this exemplary embodiment, the compressing of the first package substrate 110 and the second package substrate 120 may include contacting the molding resin material layer 129 to the first semiconductor device 111 at the third temperature T3; and relatively moving the molding resin material layer 129 closer to the first package substrate 110 at a fourth temperature T4 higher than the third temperature T3. In this exemplary embodiment, the relatively moving of the molding resin material layer 129 closer to the first package substrate 110 at the fourth temperature T4 comprises further reducing a pressure between the first package substrate 110 and the second package substrate 120 as further disclosed below.

Figure 5C:
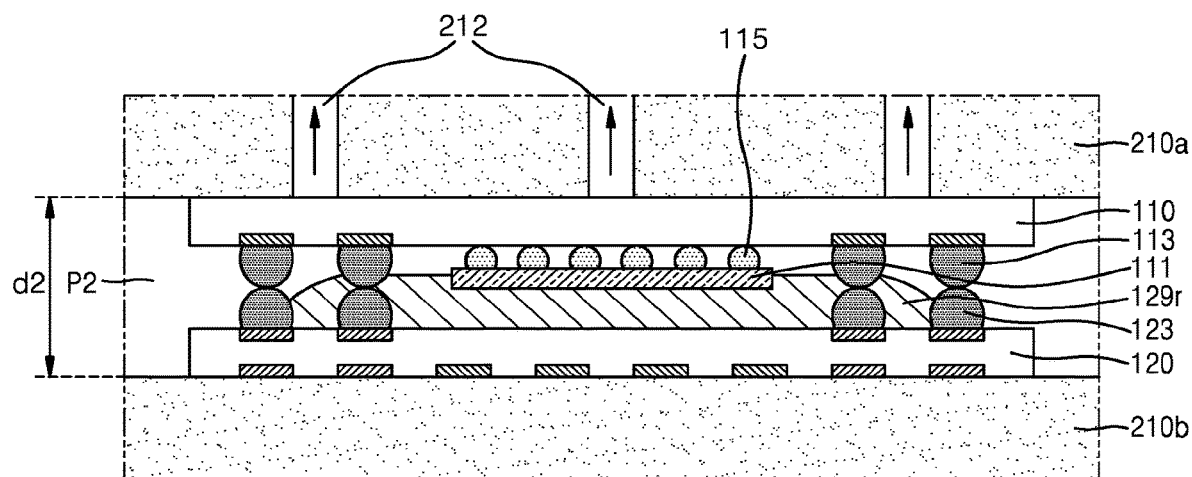

With reference to FIGS. 5C and 6, the distance between the upper mold 210a and the lower mold 210b may be decreased to d2.

In this case, the pressure between the molds may be decreased to P2 that is lower than P1 and the temperature between the molds may be increased to the fourth T4 that is higher than third T3. The fourth temperature T4 may be higher than a temperature at which the molding resin material layer 129 starts being reflowed. As the fourth temperature T4 is higher than the temperature of reflowing the molding resin material layer 129, the reflowed molding resin material layer 129r may have fluidity.

While the reflowed molding resin material layer 129r has fluidity, as the distance between the upper mold 210a and the lower mold 210b has been decreased to d2, the molding resin material layer 129r may move in lateral directions and at least partially cover the first conductive connection terminals 113 and/or the second conductive connection terminals 123.

Although it is illustrated that the first conductive connection terminals 113 and the second conductive connection terminals 123 contact in FIG. 5C, in other embodiments, the first conductive connection terminals 113 and the second conductive connection terminals 123 may be separated.

Figure 5D:
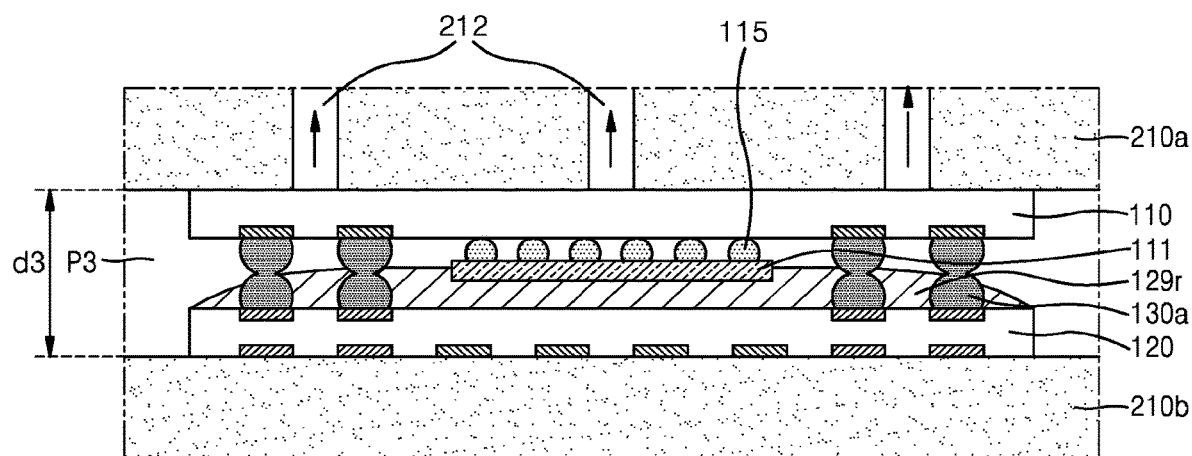

With reference to FIGS. 5D and 6, the molding resin material layer 129r may have a relatively larger movement in the lateral directions by decreasing the distance between the upper mold 210a and the lower mold 210b to d3.

In this exemplary embodiment, the pressure between the molds may be decreased from P2 to P3 and the temperature between the molds may be increased from T4 to a second temperature T2. The second temperature T2 may be higher than a temperature at which the first conductive connection terminals 113 and/or the second conductive connection terminals 123 start being reflowed.

As illustrated in FIG. 5D, the first conductive connection terminals 113 and the second conductive connection terminals 123 contact each other, and the contacted portions are melted to form surface contacts. Also, as the fourth temperature T4 is higher than a temperature at which the molding resin material layer 129r starts being reflowed, a cross-link reaction may be relatively active.

Figure 5E:
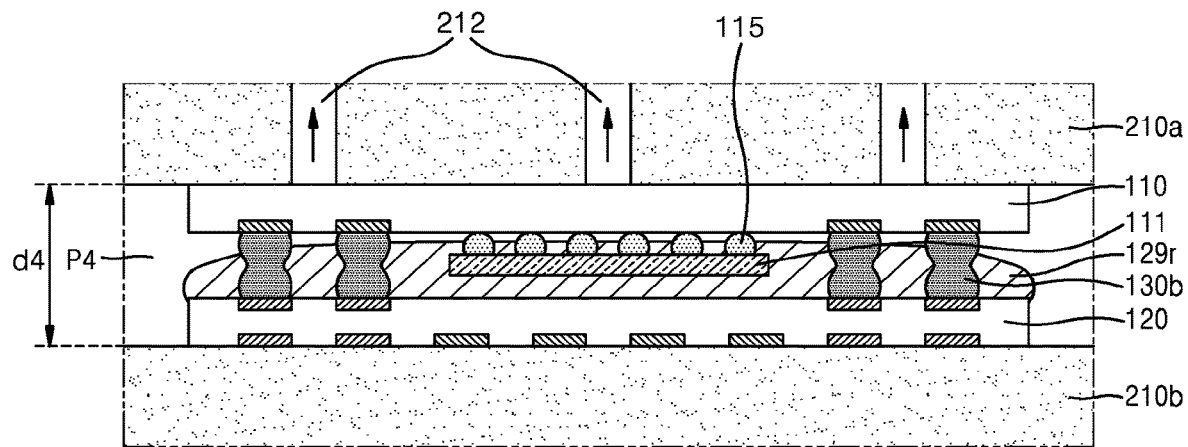

With reference to FIGS. 5E and 6, the upper surface of the molding resin material layer 129r may become closer to the first package substrate 110 by decreasing the distance between the upper mold 210a and the lower mold 210b to d4. And the molding resin material layer 129r may pass two opposite ends of the second package substrate 120 in the lateral directions and may partially protrude.

In this case, the pressure between the molds may be decreased from P3 to P4, and the temperature between the molds may be maintained at the second temperature T2. As the first package substrate 110 and the second package substrate 120 are becoming closer in a state where the pressure between the molds is decreased to P4, the molding resin material layer 129r may smoothly fill the portion between the first semiconductor device 111 and the first package substrate 110 despite a viscosity of the molding resin material layer 129r.

Figure 5F:
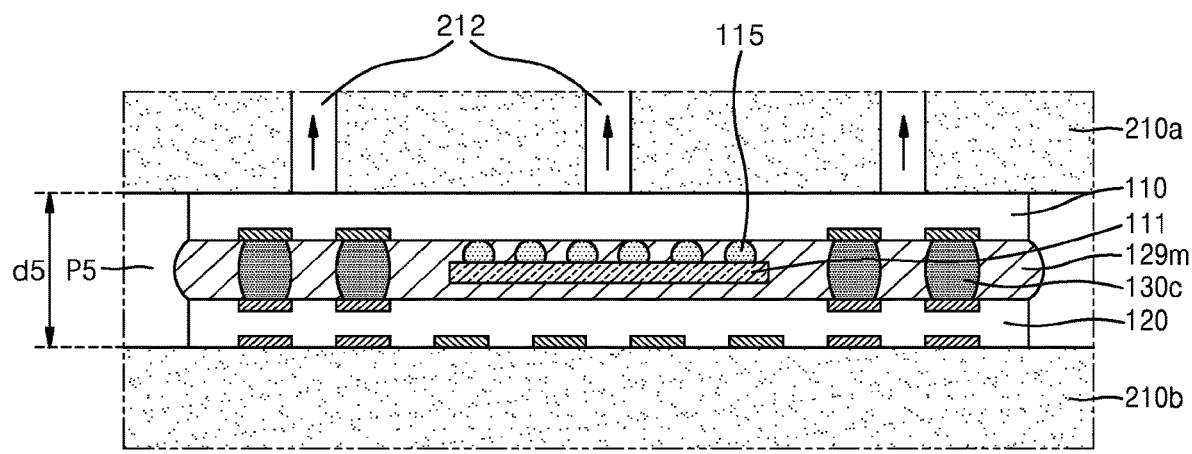

With reference to FIGS. 5F and 6, the upper surface of the molding resin material layer 129m may become closer to the first package substrate 110 by decreasing the distance between the upper mold 210a and the lower mold 210b to d5.

In this case, the pressure between the molds may be decreased to P5 that is lower than P4, and the temperature between the molds may be maintained at the second temperature T2. And thus, the molding resin material layer 129m may completely fill the portion between the first package substrate 110 and the second package substrate 120.

And by decreasing the temperature between the molds to the first temperature T0, a stack package as illustrated in FIG. 2E may be manufactured. As following processes have been described with reference FIGS. 2E and 2F, further descriptions are omitted herein.

As described above, by having the first package substrate 110 and the second package substrate 120 approach each other while gradually changing the pressure and the temperature between the molds, even a fine gap (for example, the portion between the first package substrate 110 and the first semiconductor device 111) may be filled without air cavities.

Figure 7A:
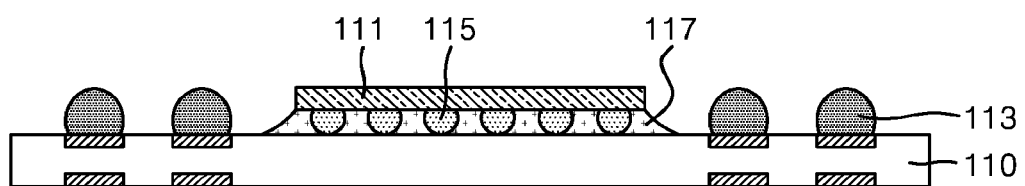
FIGS. 7A and 7B are side cross-sectional views illustrating a method of manufacturing a stack package, according to another exemplary embodiment of the inventive concept.
Figure 7B:
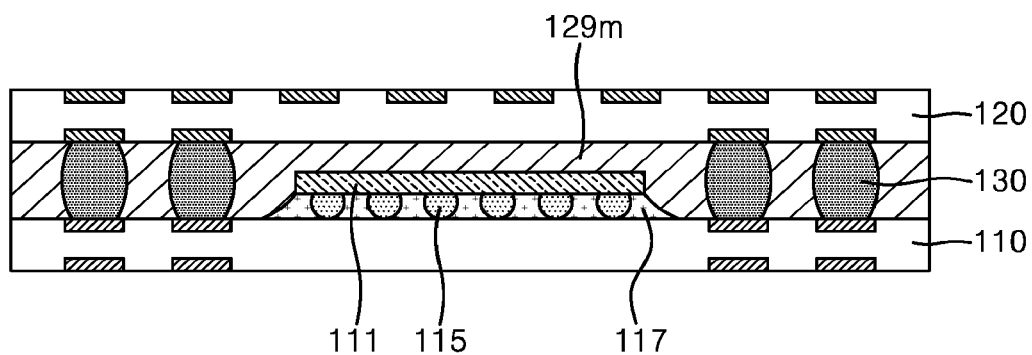

FIGS. 7A and 7B are side cross-sectional views illustrating a manufacturing method of a stack package according to another embodiment. For most of the manufacturing method described in FIGS. 7A and 7B is common to the manufacturing method described in FIGS. 2A through 2F, different parts are mainly described.

With reference to FIG. 7A, underfill 117 may be filled between the first semiconductor device 111 and the first package substrate 110. The underfill 117 may be filled by arbitrary methods known to those of skilled in the art, and may be formed by, for example, a capillary tube underfill method, a fluxing (no flow) underfill method, or a 4-corner underfill method.

And then, operations like illustrated in FIGS. 2B through 2E may be performed, and overlapped descriptions thereabout are omitted.

With reference to FIG. 7B, a stack package in which sides of the molding resin material layer 129m, sides of the first package substrate 110 and sides of the second package substrate 120 are aligned may be manufactured by trimming the molding resin material layer 129m that protrudes in the lateral directions. For example, after the hardening of the molding resin material layer 129m, the molding resin material layer 129m that protrudes in the lateral directions may be trimmed to align the sides of the molding resin material layer 129m, sides of the first package substrate 110 and sides of the second package substrate 120.

By using the manufacturing method of the inventive concept, a stack package may be manufactured easily and promptly with remarkably reduced manufacturing operations. Also, as voids are not formed near the connectors connecting upper and lower packages, a stack package with better reliability may be manufactured.

Figure 8:
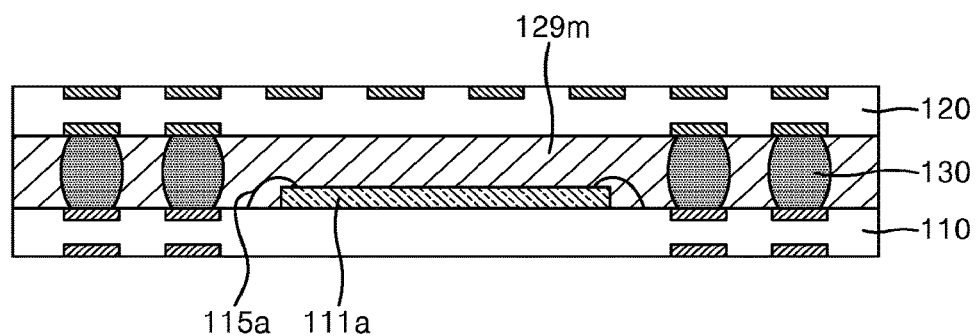
FIG. 8 is a side cross-sectional view illustrating a stack package according to another exemplary embodiment of the inventive concept.

FIG. 8 is a side cross-sectional view illustrating a stack package according to another embodiment.

With reference to FIG. 8, the stack package makes a difference in a regard that the first semiconductor device 111a is not mounted in a flip chip type and has an active surface facing upward, and is electrically connected to the first package substrate 110 by using bonding wires 115a.

The first semiconductor device 111a may be identical to the first semiconductor device 111 described with reference to FIG. 2A, and overlapped descriptions will be omitted herein.

The bonding wires 115a which electrically connect the first semiconductor device 111a to the first package substrate 110 may be configured to include gold (Au), silver (Ag), or copper (Cu) as main components, and palladium (Pd), beryllium (Be), titanium (Ti), iridium (Ir), molybdenum (Mo), tungsten (W), platinum (Pt), yttrium (Y), cerium (Ce), calcium (Ca), lanthanum (La), chromium (Cr), manganese (Mn), cobalt (Co) coated or added thereto.

When the first semiconductor device 111a is mounted by using the bonding wires 115a as illustrated in FIG. 8, complicated and difficult manufacturing methods as illustrated in FIG. 2, including multi-step of lowering pressures and raising temperatures to fill the portion between the first semiconductor device 111a and the first package substrate 110 and controlling distances between the upper and lower molds 210a and 210b to be suitable thereto, may be simplified.

Figure 9:
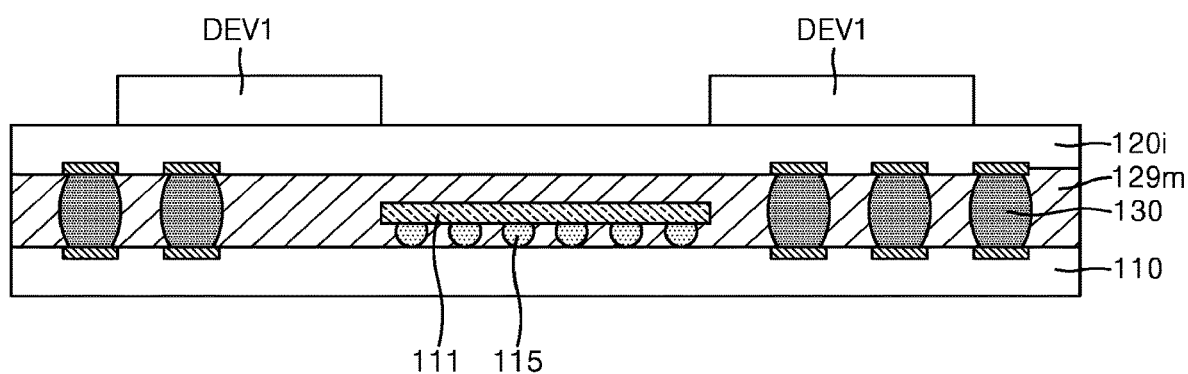
FIG. 9 is a side cross-sectional view illustrating a stack package according to another exemplary embodiment of the inventive concept.

FIG. 9 is a side cross-sectional view illustrating a stack package according to another embodiment. A stack package illustrated in FIG. 9 has a difference with the stack package illustrated in FIG. 2F in a regard that two semiconductor devices DEV1 are mounted on a second package substrate 120i, and the difference will be mainly described.

With reference to FIG. 9, the two semiconductor devices DEV1 arranged in a horizontal direction are mounted on an upper surface of the second package substrate 120i. The two semiconductor devices DEV1 may be semiconductor chips, or the semiconductor devices DEV1 may be a semiconductor package.

The two semiconductor devices DEV1 may be electrically connected by the second package substrate 120i. From this perspective, the second package substrate 120i may be considered to operate as an interposer.

Also, each of the semiconductor devices DEV1 may be electrically connected to the first package substrate 110 by the second package substrate 120i.

In the embodiments described with reference to FIGS. 1 through 7B and 9, as none of the connectors 130 use a metal core ball having a high melting point like a copper core solder ball (CCSB), such as a metal core ball having a melting point higher than 400° C., the connectors 130 do not include metal core balls having such a high melting point.

Figure 10:
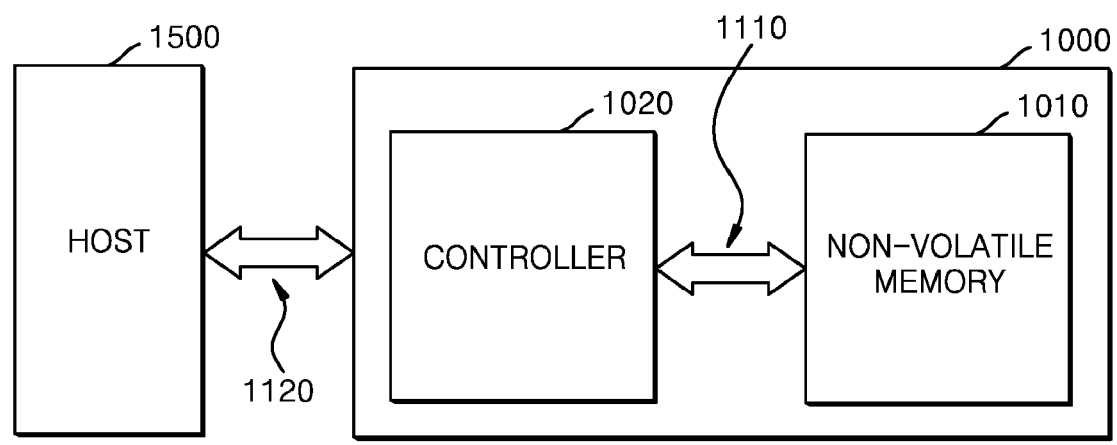
FIGS. 10 and 11 are mimetic diagrams respectively illustrating a relationship between a semiconductor package and an exterior system, according to an exemplary embodiment of the inventive concept.
Figure 11:
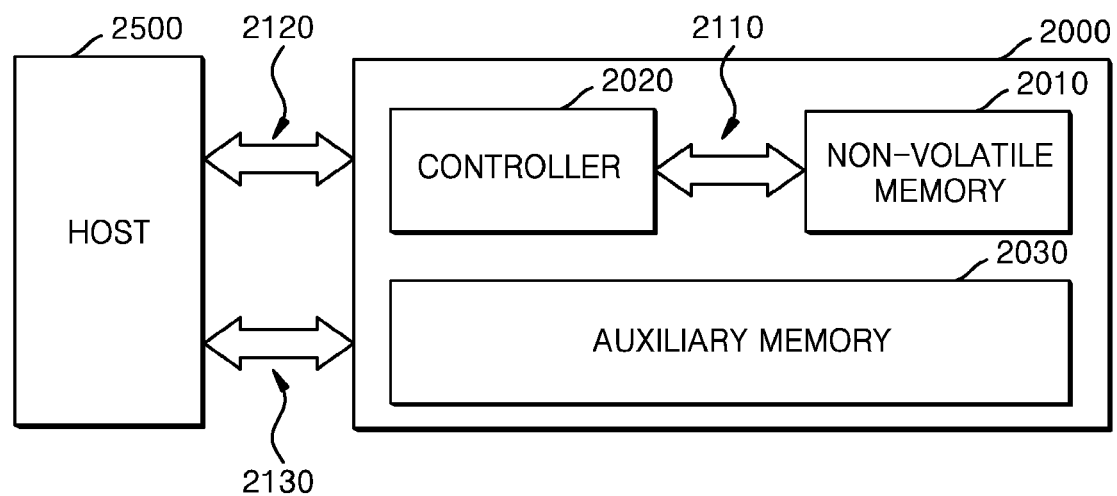

FIGS. 10 and 11 are mimetic diagrams respectively illustrating relationships between a semiconductor package according to an exemplary embodiment and an exterior system.

With reference to FIG. 10, data input from an exterior system 1500 may be stored in a semiconductor package 1000. The semiconductor package 1000 may include a non-volatile memory 1010, and a controller 1020.

The data input from the exterior system 1500 may be transferred to the controller 1020 by a host interface 1120 and may be stored in the non-volatile memory 1010 from the controller 1020 by a NAND interface 1110. Also, the controller 1020 may read data from the non-volatile memory 1010 by the NAND interface 1110 and transfer the data to the exterior system 1500 by the host interface 1120.

The semiconductor package 1000 may be one of the stack packages described with reference to FIGS. 1 through 7B and 9. The non-volatile memory 1010 may be the semiconductor devices DEV1 described with reference to FIG. 9. The controller 1020 may be one of the first semiconductor device 111 described with reference to FIG. 2A or the first semiconductor device 111a described with reference to FIG. 8.

With reference to FIG. 11, data input from an exterior system 2500 may be stored in a semiconductor package 2000. The semiconductor package 2000 may include a non-volatile memory 2010, a controller 2020, and an auxiliary memory 2030.

Part of the data input from the exterior system 2500 may be transferred to the controller 2020 by a host interface 2120 and may be stored in the non-volatile memory 2010 from the controller 2020 by a NAND interface 2110. Also, the controller 2020 may read data from the non-volatile memory 2010 by the NAND interface 2110 and transfer the data to the exterior system 2500 by the host interface 2120.

Part of the data input from the exterior system 2500 may be stored in the auxiliary memory 2030 by a DRAM interface 2130. Also, the data stored in the auxiliary memory 2030 may be transferred to the exterior system 2500 by the DRAM interface 2130.

The semiconductor package 2000 may be one of the semiconductor packages described with reference to FIGS. 1 through 7B and 9. The non-volatile memory 2010 may be the semiconductor devices DEV1 described with reference to FIG. 9. The controller 2020 may be one of the first semiconductor device 111 described with reference to FIG. 2A or the first semiconductor device 111a described with reference to FIG. 8.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A stack package, comprising:
 a first package substrate including a first surface on which a first semiconductor device is mounted;
 a second package substrate provided on the first semiconductor device, the second package substrate including a first surface facing the first surface of the first package substrate;
 a connection terminal connecting the first semiconductor device and the first package substrate;

a connector connecting a terminal on the first surface of the first package substrate and a terminal on the first surface of the second package substrate corresponding thereto; and molding resin encircling the connector while filling a portion between the first package substrate and the second package substrate, wherein a portion of the molding resin encircles the connection terminal while, without using an underfill, filling a portion between the first semiconductor device and the first package substrate and completely filling a space between an upper surface of the first semiconductor device and a lower surface of the second package substrate, wherein the molding resin contacts all side surfaces of the connector, the connector having a shape of number 8 in which an upper end and a lower end are cut off, and wherein an upper portion and a lower portion of the connector are substantially symmetrical to each other.

2. The stack package of claim 1,
wherein a cross sectional area of the connector in a horizontal direction between the first package substrate and the second package substrate is greater than a cross sectional area thereof at the terminal on the first package substrate.

3. The stack package of claim 1,
wherein a contact angle between the connector and the first package substrate is substantially identical to a contact angle between the connector and the second package substrate.

4. The stack package of claim 1,
wherein the connector does not include a metal core ball having a melting point higher than 400° C.

5. The stack package of claim 1,
wherein the first semiconductor device does not contact the second package substrate.

6. The stack package of claim 5,
wherein a portion of the molding resin is between the first semiconductor device and the second package substrate.

7. The stack package of claim 1,
wherein the molding resin comprises a convex side surface protruding from edges of the first package substrate and the second package substrate.

8. A semiconductor stack package, comprising:
a first package substrate on which a first semiconductor device is mounted;
a second package substrate provided on the first semiconductor device with a gap between a first surface of the second package substrate and the first semiconductor device;
a connection terminal connecting the first semiconductor device and the first package substrate;
a connector connecting a terminal on the first package substrate and a terminal on the second package substrate corresponding thereto; and
molding resin encircling the connector while filling a portion between the first package substrate and the second package substrate,
wherein a portion of the molding resin encircles the connection terminal while, without using an underfill, filling a portion between the first semiconductor device and the first package substrate and completely filling a space between an upper surface of the first semiconductor device and a lower surface of the second package substrate, and wherein the connector having a shape of number 8 in which an upper end and a lower end are cut off and an upper half and a lower half of the connector are substantially symmetrical to each other.

9. The semiconductor stack package of claim 8,
wherein a horizontal dimension of the connector is not the greatest at the middle in a vertical direction.

10. The semiconductor stack package of claim 8, further comprising:
two semiconductor devices on a second surface of the second package substrate,
wherein the two semiconductor devices are arranged in a horizontal direction.

11. The semiconductor stack package of claim 8,
wherein an active surface of the first semiconductor device faces the first surface of the second package substrate, and
wherein the connection terminal is a bonding wire.

12. The semiconductor stack package of claim 8,
wherein an active surface of the first semiconductor device faces the first surface of the first package substrate, and
wherein the connection terminal is a solder ball.

13. The semiconductor stack package of claim 8,
wherein the molding resin includes an elastomer component.

14. A semiconductor stack package, comprising:
a first package substrate including a first surface on which a first semiconductor device is mounted;
a second package substrate provided on the first semiconductor device, the second package substrate including a first surface facing the first surface of the first package substrate and a second surface on which a second semiconductor device is mounted;
a connection terminal connecting the first semiconductor device and the first package substrate;
a connector connecting a terminal on the first surface of the first package substrate and a terminal on the first surface of the second package substrate corresponding thereto; and
molding resin encircling the connector while filling a portion between the first package substrate and the second package substrate, the molding resin including an elastomer component,
wherein a portion of the molding resin encircles the connection terminal while, without using an underfill, filling a portion between the first semiconductor device and the first package substrate and completely filling a space between an upper surface of the first semiconductor device and a lower surface of the second package substrate,
wherein the molding resin contacts all side surfaces of the connector,
wherein a horizontal dimension of the connector varies along a vertical direction, and
wherein the connector having a shape of number 8 in which an upper end and a lower end are cut off and an upper portion and a lower portion of the connector are substantially symmetrical to each other.

* * * * *